US006119626A

United States Patent [19]

Miyazawa et al.

[11] Patent Number: 6,119,626

[45] Date of Patent: Sep. 19, 2000

[54] VACUUM APPARATUS FOR FORMING A THIN-FILM AND METHOD FOR FORMING THIN-FILM

[75] Inventors: Yoshikazu Miyazawa, Tokyo; Tomonori Aoki, Ryugasaki, both of Japan

[73] Assignee: Canon Kabushiki Kaisha, Tokyo, Japan

[21] Appl. No.: 08/967,781

[22] Filed: Nov. 10, 1997

[30] Foreign Application Priority Data

Nov. 14, 1996 [JP] Japan .................................... 8-302575

[51] Int. Cl.[7] .......................... C23C 16/448; C23C 16/00

[52] U.S. Cl. ................................ 118/723 VE; 427/248.1; 427/596

[58] Field of Search .................................... 118/726, 715, 118/723 VE; 392/388, 386, 389, 390; 427/596, 248.1, 255.12

[56] References Cited

U.S. PATENT DOCUMENTS

| | | | |
|---|---|---|---|
| 4,411,702 | 10/1983 | Makino et al. | 106/111 |
| 4,975,122 | 12/1990 | Parkinson et al. | 106/2 |
| 5,204,314 | 4/1993 | Kirlin et al. | 505/1 |
| 5,250,106 | 10/1993 | Roth et al. | 106/2 |
| 5,626,668 | 5/1997 | Gerhardinger et al. | 106/2 |
| 5,685,903 | 11/1997 | Stav et al. | 106/735 |
| 5,776,245 | 7/1998 | Thomas | 106/2 |

FOREIGN PATENT DOCUMENTS

| | | | |
|---|---|---|---|
| 60-040254 | 3/1985 | Japan | B23B 33/00 |
| 61-130902 | 6/1986 | Japan | G02B 1/10 |
| 63-296002 | 12/1988 | Japan | C23C 14/06 |
| 4-072055 | 3/1992 | Japan | C23C 14/06 |
| 6-340966 | 12/1994 | Japan | C23C 14/30 |

OTHER PUBLICATIONS

Patent Abstracts of Japan vol. 012, No. 482 (C–553), Dec. 15, 1988.

Patent Abstracts of Japan vol. 095, No. 003, Apr. 28, 1995.

Patent Abstracts of Japan vol. 016, No. 277 (C–0954), Jun. 22, 1992.

Patent Abstracts of Japan vol. 010, No. 324 (P–512), Nov. 5, 1986.

*Primary Examiner*—Shrive Beck
*Assistant Examiner*—Sylvia R. MacArthur
*Attorney, Agent, or Firm*—Fitzpatrick, Cella, Harper & Scinto

[57] ABSTRACT

A water-repellent organic substance such as an organic silicone compound or a perfluoroalkyl-group containing compound is impregnated in a porous material comprising a cold-setting substance. By evaporating the water-repellent organic substance retained in the porous material under vacuum, a water-repellent thin-film is formed on a base member for providing stain-proof and water-proof properties to the base member.

18 Claims, 1 Drawing Sheet

3
7
7
4
11
2
5
8
9
10
6

VACUUM APPARATUS FOR FORMING A THIN-FILM AND METHOD FOR FORMING THIN-FILM

BACKGROUND OF THE INVENTION

1. Field of the Invention

The present invention relates to a material used for surface-treating base members or coating films provided on base members, and a method for forming thin-films as such a surface treatment.

2. Description of the Related Art

Conventionally, for surface-treating various base members or substrates, a thin-film which is stain-proof, water-, dust-proof, etc. made from organic materials, etc. is formed onto the surface of the base members so that the surface acquires those same properties. To form such a thin-film, for example, Japanese Patent Application Laid-Open No. 60-40254 discloses a method of directly applying a water-repellent substance diluted in an organic solvent onto an under-coating layer formed on a base member Japanese Patent Application Laid-Open No. 61-130902 discloses a method of dipping a base member (lens) in a solution of a water-repellent substance. In addition, Japanese Patent Application Laid-Open No. 4-72055 discloses a method of forming a protective film on a base member by evaporating an organic substance impregnated in a porous ceramic material in a vacuum chamber and then depositing the evaporated substance on the base member. Japanese Patent Application Laid-Open No. 6-340966 discloses a method of forming an organic film on an inorganic coating film by evaporating an organic substance impregnated in a fibrous metallic mass in a vacuum chamber and then depositing the evaporated substance on the inorganic coating film.

However, such film-forming methods have the following problems:

By directly applying a water-repellent substance onto a base member, a sufficiently uniform coating film cannot always be obtained. In particular, when a water-repellent substance is applied onto an inorganic thin-film formed by vacuum processing, such as vacuum deposition, it is necessary to remove a base member from a vacuum chamber after forming an inorganic film on the base member by vacuum deposition, and then, to subject the base member to another step in order to be coated with the water-repellent substance. Thus, the process as a whole becomes complicated and uneven coating readily occurs. As a result, it is difficult to achieve a uniform water-repellent thin-film.

The dipping method requires a similar complicated process, in particular when a water-repellent substance is applied onto an inorganic thin-film formed by vacuum processing. Furthermore, since the required amount of the diluted solution of the water-repellent substance is much greater than the actual coating amount, additional equipment and cost are necessary for waste-liquid disposal.

According to the method of evaporating an organic substance impregnated in a ceramic material, steps such as pressing and high-temperature sintering are required for forming the ceramic material. Also, the porosity of the ceramic material must be finely adjusted to control the amount of the impregnated organic substance. Therefore, it is necessary to strictly control the grain size, sintering temperature, purity, etc. of the ceramic material, and correspondingly, the process for material preparation becomes more complicated and the cost increases. In addition, organic binders are frequently used for preparing ceramic materials. Thus, when organic substances (the organic binders or decomposed products thereof) remain in a ceramic material, they react or evaporate with the film-forming material (e. g., a water-repellent substance such as an organic silicone or a perfluoroalkyl-group containing compound) impregnated in the ceramic material and are deposited on the subject, i. e., base member. Thus, the properties of the resulting thin-film deteriorate, such as reduced contact angle, and the desired properties such being dust-proof and water-proof cannot be achieved.

The method of evaporating an organic material impregnated in a fibrous metallic mass is simpler than the above-mentioned other methods. However, in particular, when metals having a melting point of from 600° C. to 800° C., such as copper and aluminum, are used, the metallic mass may start melting under certain heating conditions or the melted metal per se may evaporate and adhere to the base member, resulting in adverse effects on the properties of the resulting thin-film, such as coloring or reduced contact angle. In addition, since metals have high thermal conductivity, their rate of temperature rise is high. Thus, in some cases, evaporation of the impregnated organic substance must be carefully adjusted.

SUMMARY OF THE INVENTION

Accordingly, an object of the present invention is to provide a thin-film forming material, by which a uniform thin-film having desirable properties such as being stain-proof, water-proof, dust-proof, and oil-proof can be reliably formed on a base member by a simple process, and a method for forming such a thin-film.

A thin-film forming material of the present invention is characterized in that a thin-film forming substance is impregnated in a porous material comprising a cold-setting substance.

According to the present invention, a method for forming a thin-film is characterized in that a thin-film forming substance impregnated in a porous material comprising a cold-setting substance which is evaporated to form a thin-film on a base member.

DETAILED DESCRIPTION OF THE PREFERRED EMBODIMENTS

Figure 1:
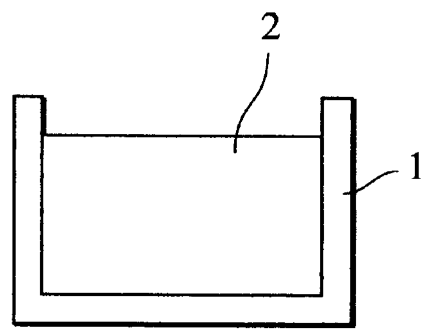
FIG. 1 is a cross-sectional diagram illustrating gypsum poured in a plastic cast for preparing a thin-film forming material of an example incorporated in the present invention.

According to a thin-film forming material of the present invention, a thin-film forming substance is retained in a porous material and is deposited on a base member, preferably by evaporation. A thin-film forming material of the present invention is characterized in that a cold-setting substance is used for the porous material.

In the present invention, "cold-setting substance" means, for example, a powder which is hardened by adding water or water-containing alcohol followed by processing (e. g., heating) at a temperature ranging from room temperature to approximately 100° C. However, also included in "cold-setting substance" are substances that per se generate heat during the setting reaction and raise the temperature of the setting process above 100° C.

Porous substances hardened by water (or water-containing alcohol) are preferably used as such cold-setting substances, as is above-mentioned. Practical examples thereof are: inorganic glutinous substances such as Portland cement and alumina cement; and inorganic porous substances such as gypsum (calcium sulfate), lime (calcium oxide or calcium hydroxide), and zinc oxide. Among these, gypsum, in particular, gypsum having a grain size distribution of 1 to 100 $\mu$m measured by centrifugal method is preferable. This is because gypsum allows easy preparation due to its following properties: it has a short setting time and a simple composition, and its grain size which affects the porosity of the hardened porous substance can be readily controlled.

The thin-film forming substance is impregnated in a cold-setting substance which has been hardened by water. However, when the thin-film forming substance is water-soluble and can be diluted with water, the cold-setting substance can be directly hardened by the solution of the thin-film forming substance and dried while simultaneously preparing the thin-film forming material by impregnating the thin-film forming substance in the cold-setting substance. When a base member on which a thin-film is formed (i. e., a base member to be surface-treated) is made of a material which must avoid water, it is necessary to reduce the amount of water entering the thin-film formed on the base member. The thin-film forming material may be prepared as follows: a cold-setting substance is hardened by water, dried at 150° C. to 700° C. evaporate the water, and then, impregnated with the thin-film forming substance to prepare a thin-film forming material having a reduced water content.

Furthermore, the porous material composed of a cold-setting substance may contain approximately 70% or less by weight of other substances not hardened at room temperature, such as an inorganic powder (e. g., quartz) having a grain size of 0.5 mm or less, to adjust the porosity to retain the optimum amount of thin-film forming substance.

To be used as a cold-setting substance, gypsum is preferably prepared as follows: calcined gypsum is hardened by adding 40% to 150% of water by weight so as to achieve a porosity for retaining the required amount of thin-film forming substance.

Thin-film forming substances employed for a thin-film forming material of the present invention are selected depending on the properties required for the resulting thin-films. For example, in the case of thin-film forming materials used for surface-treating a base member to provide water-repellency, oil-proof, dust-proof, and the like, a thin-film forming substance exhibiting such properties after being formed into thin-films is employed.

In particular, preferred examples of thin-film forming substances having water repellency are water-repellent organic materials such as organosiloxane compounds or organic silicone and perfluoroalkyl-group containing compounds. Practical examples of such organosiloxane compounds are diethoxydimethylsilane and triethoxydimethylsilane, in addition to polyorganosiloxanes disclosed in Japanese Patent Application Laid-Open 61-130902. Practical examples of the perfluoroalkyl-group containing compounds are 2-(perfluorooctyl) ethyltriaminosilane and 2-(perfluorohexyl) ethyltriaminosilane, in addition to perfluoroalkyl-group containing compounds disclosed in Japanese Patent Application Laid-Open 63-296002. Silane compounds such as chlorotriethylsilane may be also employed. These compounds can be used alone or in combination with others.

The above-mentioned thin-film forming substances, particularly the organic silicones and perfluoroalkyl-group containing compounds, are generally supplied in a form of a stock solution or a diluted solution. A thin-film forming material in which a thin-film forming substance is retained in a porous material comprising a cold-setting substance is prepared by the following methods: a method of directly dipping a porous material comprising a cold-setting substance in a stock solution or a diluted solution; a method of adding the required amount of a stock solution or a diluted solution dropwise onto the porous material by a pipet so that the solution is impregnated therein; and a method of directly hardening the cold-setting substance by using the solution, in particular, in the form of an aqueous solution (when the thin-film forming substance is water-soluble).

According to the present invention, a thin-film forming substance contained in a thin-film forming material is deposited on a base member by evaporation to form a thin-film so that the surface of the base member acquires the desired properties.

For example, a thin-film forming material contains a water-repellent substance as a thin-film forming substance. The water-repellent substance is evaporated by heating under vacuum and directly deposited on the surface of a base member or a film, e. g., an inorganic film, formed on a base member so as to make the surface water-repellent.

Halogen lamp heaters or resistance heaters are used for evaporating thin-film forming substances in the atmosphere or under reduced pressure. Preferably, a thin-film forming material is heated in a closed system such as a vacuum chamber.

The evaporation conditions under vacuum are determined depending on the kinds and conditions of thin-film forming materials and base members. For example, when a water-repellent substance is deposited by heat evaporation on an optical lens prepared by forming an inorganic coating thin-film (e. g., $SiO_2$) on a plastic base member, the degree of vacuum is preferably set to $10^{-6}$ to $10^{-3}$ Torr.

According to the present invention, the type of base members to be coated with a thin-film is not particularly limited. For example, when a water-repellent thin-film is formed from a water-repellent thin-film forming substance, any type of base member can be used as long as it has an inorganic coating film as the top layer, and practical examples thereof are glass lenses, plastic lenses, optical filters, front wind shields of automobiles, and display panels, each having an inorganic anti-reflection film thereon.

Further objects, features and advantages of the present invention will become apparent from the following description of Examples with reference to the attached drawings. However, the present invention is not restricted to the following Examples.

EXAMPLE 1

Figure 2:
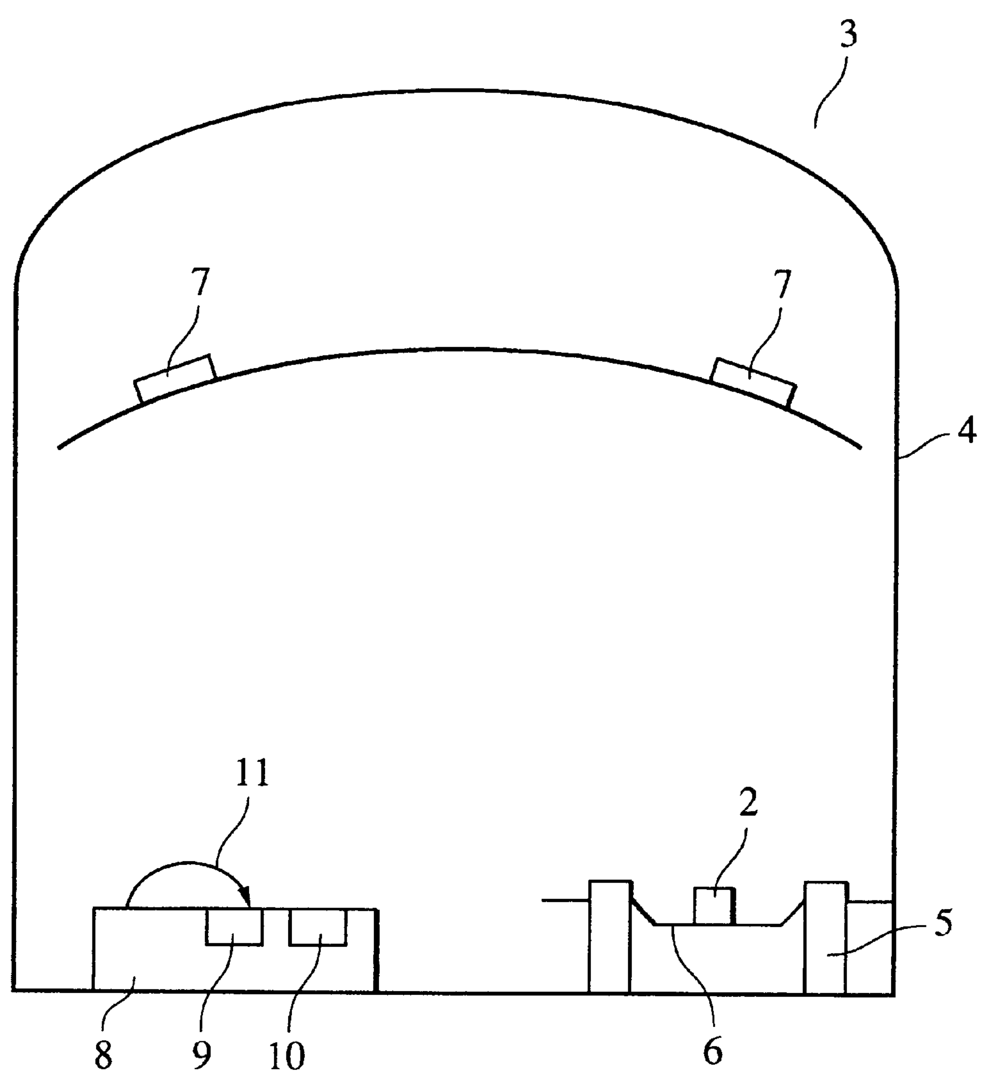
FIG. 2 shows a structure of a vacuum deposition apparatus used in examples of the present invention.

To 50 g of gypsum having the grain size distribution of 5 to 50 $\mu$m ("PLASTER OF PARIS" manufactured by SAN ESU GYPSUM CO., LTD.), 25 g of water was added and thoroughly stirred for 1 min. The mixture was poured into a plastic cast 1 having a diameter of 18 mm and a depth of 10 mm shown in FIG. 1, followed by drying at room temperature for 1 hour. In the gypsum contained in the cast 1, 1 ml of a 3% solution of $n\text{-}C_8F_{17}CH_2CH_2Si(NH_2)_3$, i. e., a perfluoroalkyl-group containing compound, diluted with meta-xylenehexafluoride was impregnated by a pipet as a solution for water-repellent treatment. The gypsum was then dried at 70° C. for 20 min. to obtain gypsum 2 retaining the thin-film forming substance. The gypsum 2 was removed from the cast 1 and placed inside a vacuum chamber 4 of a vacuum evaporation apparatus (VACUUM THIN FILM COATER VE800, manufactured by SHINCRON CO., LTD) 3 shown in FIG. 2. In the vacuum evaporation apparatus 3, a resistance heating board 6 was installed between resistance heating electrodes 5 provided inside the vacuum chamber 4, and the gypsum 2 was placed on the resistance heating board 6, as is shown in FIG. 2.

As base members to be deposited, lenses 7 made of a synthesized resin comprising diethylene glycol bisallylcarbonate resin were set inside the vacuum chamber 4. Deposition was carried out by electron-beam evaporation as follows: an electron beam 11 was radiated on deposition materials of $ZrO_2$ 9 and $SiO_2$ 10 from an electron gun 8 facing the lenses 7 so that $SiO_2$ thin-films and $ZrO_2$ thin-films were alternately formed on the lenses 7 one by one. As a result, lenses 7 were each coated with an anti-reflection film such that an approximately 3 $\mu$m thick $SiO_2$ thin-film, an approximately 0.015 $\mu$m thick $ZrO_2$ thin-film, an approximately 0.02 $\mu$m thick $SiO_2$ thin-film, an approximately 0.1 $\mu$m thick $ZrO_2$ thin-film, and an approximately 0.08 $\mu$m thick $SiO_2$ thin-film were formed in the above order from the lens side.

After forming the anti-reflection coating, the lenses 7 were left inside the vacuum chamber 4. The gypsum 2 retaining the thin-film forming substance, i. e., the thin-film forming material, set on the resistance heating board 6 was heated at approximately 500° C. for 3 min. so that the perfluoroalkyl-group containing compound was evaporated to deposit a water-repellent thin-film on the anti-reflection coating of the lenses 7.

After deposition, the lenses 7 were removed from the vacuum chamber 4 to observe the surface conditions and measure the contact angle with respect to water by a CONTACT ANGLE METER MODEL CA-Z (manufactured by KYOWA INTERFACE SCIENCE CO., LTD.). After measurement, the surface of the lenses 7 was rubbed back and forth for 50 cycles with a lens tissue sheet containing acetone while loading approximately 1 Kg of weight thereon. The contact angle of the lenses 7 was then measured again to evaluate the effect of rubbing. In addition, after leaving the lenses 7 in the atmosphere for one week, the surface observation and contact-angle measurement (before and after rubbing the surface of the lens) were carried out again similarly to the above. Table 1 shows the results.

EXAMPLE 2

To 50 g of gypsum having the grain size distribution of 5 to 50 $\mu$m ("PLASTER OF PARIS" manufactured by SAN ESU GYPSUM CO., LTD.), 25 g of water was added and thoroughly stirred for 1 min. The mixture was poured into the plastic cast 1 having a diameter of 18 mm and a depth of 10 mm shown in FIG. 1, followed by drying for 1 hour at room temperature and further 1 hour in an oven at 200° C. for evaporating water. In the gypsum contained in the cast 1, 1 ml of a 3% solution of n-$C_8F_{17}CH_2CH_2Si(NH_2)_3$, i. e., a perfluoroalkyl-group containing compound, diluted with meta-xylenehexafluoride was impregnated by a pipet as a solution for water-repellent treatment. The gypsum was then dried at 70° C. for 20 min. to obtain gypsum 2 retaining the thin-film forming substance. Similarly to Example 1, the gypsum 2 was removed from the cast 1 and placed on the resistance heating board 6 inside the vacuum chamber 4 of the vacuum evaporation apparatus 3 shown in FIG. 2.

Following the same procedure as that of Example 1, an anti-reflection coating (composed of $SiO_2$ thin-films and $ZrO_2$ thin-films) was formed on the lenses 7 by vacuum evaporation, and then, a water-repellent thin-film was deposited by vacuum evaporation from the gypsum 2, i. e., thin-film forming material, placed on the resistance heating board 6. The thin-film side surface of the lenses 7 was subjected to the surface observation and measurement of contact angle with respect to water similarly to Example 1 (both immediately after forming the water-repellent film and after being left in the atmosphere for one week). Table 1 shows the results.

EXAMPLE 3

To 50 g of gypsum having the grain size distribution of 5 to 50 $\mu$m ("PLASTER OF PARIS" manufactured by SAN ESU GYPSUM 15 CO., LTD.), 25 g of a 3% aqueous solution of $CF_3(CH_2)_2SiCl_3$ was added and thoroughly stirred for 1 min. The resulting mixture was poured into the plastic cast 1 having a diameter of 18 mm and a depth of 10 mm shown in FIG. 1, followed by drying at room temperature for 1 hour to obtain gypsum 2 retaining the thin-film forming substance. Similarly to Example 1, the dried gypsum 2 was removed from the cast 1, and placed on the resistance heating board 6 inside the vacuum chamber 4 of the vacuum evaporation apparatus 3 shown in FIG. 2.

Following the same procedure as that of Example 1, anti-reflection coating (composed of $SiO_2$ thin-films and $ZrO_2$ thin-films) was formed on the lenses 7 by vacuum evaporation, and then, a water-repellent thin-film was formed by vacuum evaporation from the gypsum 2, i. e., thin-film forming material, placed on the resistance heating board 6. The thin-film side surface of the lenses 7 was subjected to the surface observation and measurement of contact angle with respect to water similarly to Example 1 (both immediately after forming the water-repellent film and after being left in the atmosphere for one week). Table 1 shows the results.

EXAMPLE 4

To 50 g of gypsum having the grain size distribution of 5 to 50 $\mu$m ("PLASTER OF PARIS" manufactured by SAN ESU GYPSUM CO., LTD.), 25 g of water was added and thoroughly stirred for 1 min. The mixture was poured into the plastic cast 1 having a diameter of 18 mm and a depth of 10 mm shown in FIG. 1, followed by drying for 1 hour at room temperature and further 1 hour in an oven at 200° C. for evaporating water. In the gypsum contained in the cast 1, 0.5 ml of n-$C_8F_{17}CH_2CH_2Si(OCH_3)_3$, i. e., a perfluoroalkyl-group containing compound, was impregnated by a pipet without diluting. The gypsum was then removed from the cast 1 and dried at 70° C. for 20 min. to obtain gypsum 2 retaining the thin-film forming substance. Similarly to Example 1, the gypsum 2 was placed on the resistance heating board 6 inside the vacuum chamber 4 of the vacuum evaporation apparatus 3 shown in FIG. 2.

Following the same procedure as that of Example 1, an anti-reflection coating (composed of $SiO_2$ thin-films and $ZrO_2$ thin-films) was formed on the lenses 7 by vacuum evaporation, and then, a water-repellent thin-film was formed by vacuum evaporation from the gypsum 2, i. e., thin-film forming material, placed on the resistance heating board 6. The thin-film side surface of the lenses 7 was subjected to the surface observation and measurement of contact angle with respect to water similarly to Example 1 (both immediately after forming the water-repellent film and after being left in the atmosphere for one week). Table 1 shows the results.

EXAMPLE 5

Following the same procedure as that of Example 1, an anti-reflection coating (composed of $SiO_2$ thin-films and $ZrO_2$ thin-films) was formed on the lenses 7 by vacuum evaporation. The resulting lenses 7 were removed from the vacuum chamber 4, and then, directly coated with a 3% diluted solution of n-$C_8F_{17}CH_2CH_2Si(NH_2)_3$, i. e., a perfluoroalkyl-group containing compound, in meta-xylenehexafluoride as a solution for water-repellent treatment by a brush. The thin-film side surface of the lenses 7 was subjected to the surface observation and measurement of contact angle with respect to water similarly to Example 1 (both immediately after forming the water-repellent film and after being left in the atmosphere for one week). Table 1 shows the results.

The surface of the lenses 7 of Example 5 became partially opaque after one-week of storage and could not be used as lenses for glasses. This phenomenon seems to be attributed to the following: since the water repellent substance was applied by a brush, the layer of the substance became undesirably thick so that the functional groups in the substance reacted with moisture in the atmosphere and became opaque.

EXAMPLE 6

Following the same procedure as that of Example 1, an anti-reflection coating (composed of $SiO_2$ thin-films and $ZrO_2$ thin-films) was formed on the lenses 7 by vacuum evaporation. The resulting lenses 7 were removed from the vacuum chamber 4 and directly dipped in a 3% diluted solution of n-$C_2F_{17}CH_2CH_2Si(NH_2)_3$, i. e., a perfluoroalkyl group-containing compound, in meta-xylenehexafluoride. The thin-film side surface of the lenses 7 was subjected to the surface observation and measurement of contact angle with respect to water similarly to Example 1 (both immediately after forming the water-repellent film and after being left in the atmosphere for one week). Table 1 shows the results.

The surface of the lenses 7 of Example 6 became partially opaque after one-week of storage and could not be used as lenses for glasses. This phenomenon seems to be attributed to the following: since the water repellent substance was dipped into the solution, the layer of the water repellent substance was undesirably thick so that the functional groups in the substance reacted with moisture in the atmosphere and became opaque.

EXAMPLE 7

In steel wool stuffed in a copper container having a diameter of 18 mm and a depth of 10 mm, 1 ml of a 3% diluted solution of n-$C_8F_{17}CH_2CH_2Si(NH_2)_3$, i. e., a perfluoroalkyl-group containing compound, in meta-xylenehexafluoride was impregnated by a pipet as a solution for water-repellent treatment. The steel wool was then dried at 70° C. for 20 min. and placed on the resistance heating board 6 inside the vacuum chamber 4 of the vacuum evaporation apparatus 3 used in Example 1 (see FIG. 2).

Following the same procedure as that of Example 1, anti-reflection coating (composed of $SiO_2$ thin-films and $ZrO_2$ thin-films) was formed on the lenses 7 by vacuum evaporation, and then, a water-repellent film was formed using the thin-film forming material, i. e. the steel wool impregnated with n-$C_8F_{17}CH_2CH_2Si(NH_2)_3$, placed on the resistance heating board 6 by vacuum evaporation. The thin-film side surface of the lenses 7 was subjected to the surface observation and measurement of contact angle with respect to water similarly to Example 1 (both immediately after forming the water-repellent film and after being left in the atmosphere for one week). Table 1 shows the results.

After forming the water-repellent film by vacuum evaporation, a trace amount of copper adhered to the resistance heating board. This phenomenon seems to be attributed to the fact that a trace amount of the copper container melted.

EXAMPLE 8

In steel wool stuffed in a copper container having a diameter of 18 mm and a depth of 10 mm, 1 ml of a 3% diluted solution of n-$C_8F_{17}CH_2CH_2Si(NH_2)_3$, i. e., a perfluoroalkyl-group containing compound, in meta-xylenehexafluoride was impregnated by a pipet as a solution for water-repellent treatment. The steel wool was then dried at 70° C. for 20 min., removed from the copper container, and placed on the resistance heating board 6 inside the vacuum chamber 4 of the vacuum evaporation apparatus 3 used in Example 1 (see FIG. 2).

Following the same procedure as that of Example 1, an anti-reflection coating (composed of $SiO_2$ thin-films and $ZrO_2$ thin-films) was formed on the lenses 7 by vacuum evaporation, and then, a water-repellent film was formed by vacuum deposition using the thin-film forming material, i. e. the steel wool impregnated with n-$C_8F_{17}CH_2CH_2Si(NH_2)_3$, placed on the resistance heating board 6. The thin-film side surface of the lenses 7 was subjected to the surface observation and measurement of contact angle with respect to water similarly to Example 1 (both immediately after forming the water-repellent film and after being left in the atmosphere for one week). Table 1 shows the results.

In Example 8, during forming the water-repellent thin-film, the steel wool was moved on the resistance heating board 6 by the air flow exhaust from the vacuum chamber 4 and could not be stably held thereon. Therefore, the resulting thin-film could not satisfy the desired thickness nor uniformity.

EXAMPLE 9

To 50 g of commercially available Portland cement having the grain size distribution of 1 to 30 μm, 20 g of water was added and thoroughly stirred for 1 min. The mixture was poured into the plastic cast 1 having a diameter of 18 mm and a depth of 10 mm shown in FIG. 1, followed by drying for 1 hour at room temperature and further 1 hour in an oven at 200° C. for evaporating water. In the cement contained in the cast 1, 1 ml of a 3% solution of n-$C_8F_{17}CH_2CH_2Si(NH_2)_3$, i. e., a perfluoroalkyl-group containing compound, diluted with meta-xylenehexafluoride was impregnated by a pipet as a solution for water-repellent treatment. The cement was then dried at 70° C. for 20 min. to obtain cement 2 retaining the thin-film forming substance. Similarly to Example 1, the cement 2 was removed from the cast 1 and placed on the resistance heating board 6 inside the vacuum chamber 4 of the vacuum evaporation apparatus 3 shown in FIG. 2.

Following the same procedure as that of Example 1, an anti-reflection coating (composed of $SiO_2$ thin-films and $ZrO_2$ thin-films) was formed on the lenses 7 by vacuum evaporation, and then, a water-repellent thin-film was deposited by vacuum evaporation from the cement 2, i. e., thin-film forming material, placed on the resistance heating board 6. The thin-film side surface of the lenses 7 was subjected to the surface observation and measurement of contact angle with respect to water similarly to Example 1

(both immediately after forming the water-repellent film and after being left in the atmosphere for one week). Table 1 shows the results.

EXAMPLE 10

To 50 g of gypsum having the grain size distribution of 5 to 50 μm ("PLASTER OF PARIS" manufactured by SAN ESU GYPSUM CO., LTD.) and 10 g of powdery silicon dioxide having the grain size distribution of approximately 35 μm or less ("Silicon oxide" manufactured by KISHIDA CHEMISTRY CO., LTD.), 25 g of water was added and thoroughly stirred for 1 min. The mixture was poured into the plastic cast 1 having a diameter of 18 mm and a depth of 10 mm shown in FIG. 1, followed by drying for 1 hour at room temperature and further 1 hour in an oven at 200° C. for evaporating water. In the gypsum contained in the cast 1, 1 ml of a 3% solution of n-$C_8F_{17}CH_2CH_2Si(NH_2)_3$, i. e., a perfluoroalkyl-group containing compound, diluted with metaxylenehexafluoride was impregnated by a pipet as a solution for water-repellent treatment. The gypsum was then dried at 70° C. for 20 min. to obtain gypsum 2 retaining the thin-film forming substance. Similarly to Example 1, the gypsum 2 was removed from the cast 1 and placed on the resistance heating board 6 inside the vacuum chamber 4 of the vacuum evaporation apparatus 3 shown in FIG. 2.

Following the same procedure as that of Example 1, anti-reflection coating (composed of $SiO_2$ thin-films and $ZrO_2$ thin-films) was formed on the lenses 7 by vacuum evaporation, and then, a water-repellent thin-film was deposited by vacuum evaporation from the gypsum 2, i. e., thin-film forming material, placed on the resistance heating board 6. The thin-film side surface of the lenses 7 was subjected to the surface observation and measurement of contact angle with respect to water similarly to Example 1 (both immediately after forming the water-repellent film and after being left in the atmosphere for one week). Table 1 shows the results.

comprising a cold-setting substance stably retains the thin-film forming substances.

As is mentioned above, according to the present invention, a thin-film forming material in which a thin-film forming substance is retained in a porous material comprising a cold-setting substance is provided. From such a thin-film forming material, a high-quality thin-film can be formed on a base member at low cost by a simple process.

It is to be understood that the present invention is not restricted to the above examples, and variations and modifications can be effected within the spirit and scope of the present invention.

What is claimed is:

1. A vacuum evaporation apparatus, comprising:

a vacuum chamber;

a porous material made of a cold-setting substance impregnated with a thin-film forming substance set inside said vacuum chamber;

a heating means to heat said porous material for evaporating said thin-film forming substance; and a base member on which said thin-film forming substance deposits.

2. A vacuum evaporation apparatus as set forth in claim 1, wherein said thin-film forming substance comprises a water-repellent organic substance.

3. A vacuum evaporation apparatus as set forth in claim 2, wherein said water-repellent organic substance is selected from the group consisting of organic silicone compounds or perfluoroalkyl-group containing compounds.

4. A vacuum evaporation apparatus as set forth in claim 1, wherein said cold-setting substance is hardened by water.

5. A vacuum evaporation apparatus as set forth in claim 1, wherein said cold-setting substance comprises a cement.

6. A vacuum evaporation apparatus as set forth in claim 1, wherein said cold-setting substance comprises gypsum.

7. A vacuum evaporation apparatus as set forth in claim 6, wherein said gypsum has a grain size distribution of from 1 to 100 μm.

TABLE 1

| | Immediately after film formation | | | After 1 week (in the atmosphere) | | |
|---|---|---|---|---|---|---|
| | Surface | Before rubbing | After rubbing | Surface | Before rubbing | After rubbing |
| Example 1 | No coloring | 112.3 | 110.5 | No coloring | 110.8 | 110.2 |
| Example 2 | No coloring | 112.5 | 108.7 | No coloring | 108.5 | 108.5 |
| Example 3 | No coloring | 95.2 | 92.0 | No coloring | 92.1 | 91.8 |
| Example 4 | No coloring | 108.2 | 106.5 | No coloring | 106.5 | 105.5 |
| Example 5 | No coloring | 109.2 | 108.8 | Opaque | 102.5 | 99.2 |
| Example 6 | No coloring | 108.4 | 104.2 | Opaque | 103.5 | 99.8 |
| Example 7 | No coloring | 110.5 | 110.0 | No coloring | 109.8 | 108.8 |
| Example 8 | No coloring | 40.5 | 38.2 | No coloring | 42.2 | 38.5 |
| Example 9 | No coloring | 112.3 | 110.5 | No coloring | 109.5 | 109.0 |
| Example 10 | No coloring | 110.3 | 110.5 | No coloring | 108.5 | 107.0 |

From the results shown in Table 1, it is understood that changes in the contact angle with respect to water due to external influences, in other words, changes in water-repellency, are reduced in the water-repellent thin-films of Examples 1 to 4, 9 and 10 formed on the surface of the synthesized-resin lenses (having anti-reflection coating thereon) by vacuum evaporation. In other words, the water-repellent thin-films of Examples 1 to 4, 9 and 10 exhibit stable properties.

In addition, the thin-film forming materials of Examples 1 to 4, 9 and 10 can be readily placed in the apparatus during the vacuum deposition process because a porous material

8. A vacuum evaporation apparatus as set forth in claim 1, wherein said porous material comprising the cold-setting substance contains 70% or less by weight of a substance which does not set at room temperature.

9. A vacuum evaporation apparatus as set forth in claim 1, wherein said porous material comprising said cold-setting substance is hardened while containing water or a water-soluble water-repellent substance.

10. A vacuum evaporation apparatus as set forth in claim 1, wherein said base member is a glass lens, a plastic lens, an optical filter, a front window shield or a display panel.

11. A vacuum evaporation apparatus as set forth in claim 10, wherein said base member has an inorganic coating film.

12. A vacuum evaporation apparatus as set forth in claim 11, wherein said inorganic coating film is an anti-reflection film.

13. A vacuum evaporation apparatus as set forth in claim 11, wherein said heating means is a halogen lamp heater or a resistance heater.

14. A method for forming a thin-film comprising a step for forming a thin-film on a base member by evaporating a thin-film forming substance retained in a porous material, wherein said porous material comprises a cold-setting substance.

15. A method for forming a thin-film as set forth in claim 14, wherein said thin-film forming substance comprises a water-repellent organic substance, and a water-repellent thin-film is formed on said base member.

16. A method for forming a thin-film as set forth in claim 14, wherein said thin-film is formed on an inorganic layer provided on said base member.

17. A method for forming a thin-film as set forth in claim 14, wherein said thin-film is formed in a vacuum chamber.

18. A method for forming a thin-film as set forth in claim 16, wherein said inorganic layer is formed on said base member in a vacuum chamber and a water-repellent thin-film is formed on said inorganic layer in the same vacuum chamber.

* * * * *

UNITED STATES PATENT AND TRADEMARK OFFICE
CERTIFICATE OF CORRECTION

PATENT NO. : 6,119,626
DATED : September 19, 2000
INVENTOR(S) : Yoshikazu Miyazawa et al.

It is certified that error appears in the above-identified patent and that said Letters Patent is hereby corrected as shown below:

Column 1,
Line 14, "water-" should read -- water-proof, --; and
Line 21, "member" should read --member. --.

Column 2,
Line 39, "subtance" should read -- substance is --.

Column 3,
Line 29, "evaporate" should read -- to evaporate --;
Line 41, "so as" should be deleted; and
Line 49, "oil-proof, dust-proof," should read -- oil-repellency, dust-repellency, --;
Line 60, "61-130902." should read -- N0. 61-130902 --; and
Line 65, "Laid-Open 63-296002." should read -- Laid-Open No.63-296002.--.

Column 6,
Line 15, "15" should be deleted; and
Line 26, "anti-reflection" should read -- an anti-reflection --.

Column 9,
Line 19, "metaxylenehexafluoride" should read -- meta-xylenehexafluoride --; and
Line 28, "anti-reflection" should read -- an anti-reflection --.

Signed and Sealed this

Fourth Day of September, 2001

*Attest:*

NICHOLAS P. GODICI

*Attesting Officer*

*Acting Director of the United States Patent and Trademark Office*